United States Patent
Seshadri et al.

(10) Patent No.: US 10,276,452 B1
(45) Date of Patent: Apr. 30, 2019

(54) LOW UNDERCUT N-P WORK FUNCTION METAL PATTERNING IN NANOSHEET REPLACEMENT METAL GATE PROCESS

(71) Applicant: International Business Machines Corporation, Armonk, NY (US)

(72) Inventors: Indira Seshadri, Niskayuna, NY (US); Ekmini Anuja De Silva, Slingerlands, NY (US); Jing Guo, Niskayuna, NY (US); Romain J. Lallement, Troy, NY (US); Ruqiang Bao, Niskayuna, NY (US); Zhenxing Bi, Niskayuna, NY (US); Sivananda Kanakasabapathy, Pleasanton, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/867,834

(22) Filed: Jan. 11, 2018

(51) Int. Cl.
*H01L 21/8238* (2006.01)
*H01L 21/308* (2006.01)
(Continued)

(52) U.S. Cl.
CPC ........... *H01L 21/823842* (2013.01); *H01L 21/28185* (2013.01); *H01L 21/3081* (2013.01); *H01L 21/823821* (2013.01); *H01L 27/0924* (2013.01); *H01L 29/0673* (2013.01); *H01L 29/42392* (2013.01); *H01L 29/6653* (2013.01); *H01L 29/6681* (2013.01); *H01L 29/66553* (2013.01); *H01L 29/7853* (2013.01)

(58) Field of Classification Search
CPC .................................................. H01L 21/8238
See application file for complete search history.

(56) References Cited

U.S. PATENT DOCUMENTS 5,489,553 A   2/1996   Chen
5,536,681 A   7/1996   Jang et al.
(Continued)

OTHER PUBLICATIONS

K. Komura et al., "Spin-On Organic Hardmask for Topo-Patterned Substrate," Proceedings of the International Society of for Optics and Photonics (SPIE), Advances in Patterning Materials and Processes XXXI, Mar. 27, 2014, 7 pages, vol. 9051.

Primary Examiner — Marvin Payen
(74) Attorney, Agent, or Firm — Vazken Alexanian; Ryan, Mason & Lewis, LLP

(57) ABSTRACT

A method of forming a semiconductor structure includes forming first and second stacked nanosheet channel structures on a semiconductor substrate, with each nanosheet channel structure including a plurality of stacked channel regions interspersed with sacrificial regions. In a resulting semiconductor structure, an N-type stacked nanosheet channel structure is formed on the semiconductor substrate, and a P-type stacked nanosheet channel structure is formed adjacent to the N-type stacked nanosheet channel structure on the semiconductor substrate. Each of the adjacent N-type and P-type stacked nanosheet channel structures includes a plurality of stacked channel regions with each such channel region being substantially surrounded by a gate dielectric layer and a gate work function metal layer. The gate dielectric and gate work function metal layers of the adjacent N-type and P-type stacked nanosheet channel structures are substantially eliminated from a shared gate region between the adjacent N-type and P-type stacked nanosheet channel structures.

14 Claims, 6 Drawing Sheets

(51) Int. Cl.
*H01L 21/28* (2006.01)
*H01L 27/092* (2006.01)
*H01L 29/423* (2006.01)
*H01L 29/06* (2006.01)
*H01L 29/66* (2006.01)
*H01L 29/78* (2006.01)

(56) References Cited

U.S. PATENT DOCUMENTS

| | | |
|---|---|---|
| 8,658,518 B1 | 2/2014 | Chang et al. |
| 9,287,357 B2 | 3/2016 | Rodder et al. |
| 9,331,146 B2 | 5/2016 | Chen et al. |
| 9,362,177 B1 | 6/2016 | Haensch et al. |
| 2014/0264572 A1 | 9/2014 | Kim et al. |
| 2017/0222024 A1 | 8/2017 | Bergendahl et al. |
| 2017/0263705 A1 | 9/2017 | Cheng et al. |

LOW UNDERCUT N-P WORK FUNCTION METAL PATTERNING IN NANOSHEET REPLACEMENT METAL GATE PROCESS

BACKGROUND

The present application relates to manufacturing of semiconductor integrated circuits, and more particularly to formation of field effect transistor (FET) devices in such integrated circuits. Continued innovations in semiconductor process technologies are enabling higher integration densities and associated device scaling. As the semiconductor industry moves towards the 7 nm production node and beyond, FET devices must be scaled to smaller dimensions to provide an increased effective channel width per footprint area. Such scaling in some cases is achieved using nanosheet FET devices. A given nanosheet FET device comprises a channel which includes multiple nanosheet layers arranged in a stacked configuration, with each such nanosheet layer having a vertical thickness that is substantially less than its width. A common gate structure is formed in areas above and below the nanosheet layers in the stacked configuration, thereby increasing the effective channel width of the resulting device, and thus the drive current it can support, for a given footprint area. Nanosheet technologies are considered to be a viable option for continued scaling of metal-oxide-semiconductor (MOS) devices, such as complementary MOS (CMOS) devices each comprising an N-type FET (NFET) and a P-type FET (PFET). However, problems can arise in conjunction with lithographic patterning of nanosheet device features at production nodes below 10 nm. For example, in patterning work function metal (WFM) portions of nanosheet FET devices in conjunction with replacement metal gate (RMG) formation, etching operations applied to release nanosheet layers of an NFET device channel structure can lead a severe undercut of a portion of the WFM of a corresponding adjacent PFET device channel structure, and vice-versa. A need therefore exists for techniques for alleviating such drawbacks in the formation of nanosheet FET devices.

SUMMARY

Illustrative embodiments of the invention provide techniques for low undercut N-P work function metal patterning in the formation of a semiconductor device such as a CMOS device comprising an NFET and a PFET. Such arrangements can provide improved efficiency in manufacture of CMOS integrated circuit devices and corresponding reductions in integrated circuit manufacturing costs.

In one embodiment, a method of forming a semiconductor structure comprises forming first and second stacked nanosheet channel structures on a semiconductor substrate, with each nanosheet channel structure comprising a plurality of stacked channel regions interspersed with sacrificial regions. The first stacked nanosheet channel structure is blocked, and channel regions of the second stacked nanosheet channel structure are released by removing the sacrificial regions of the second stacked nanosheet channel structure while the first stacked nanosheet channel structure is blocked. The first stacked nanosheet channel structure is then unblocked, a first gate dielectric layer is formed over the first and second stacked nanosheet channel structures, and a first gate work function metal layer is formed over the first gate dielectric layer. The second stacked nanosheet channel structure is then blocked and the first gate dielectric layer and the first gate work function metal layer are removed from the first stacked nanosheet channel structure while the second stacked nanosheet channel structure is blocked. Channel regions of the first stacked nanosheet channel structure are released by removing the sacrificial regions of the first stacked nanosheet channel structure while the second stacked nanosheet channel structure is blocked. The second stacked nanosheet channel structure is then unblocked and a second gate dielectric layer is formed over the first and second stacked nanosheet channel structures. The first stacked nanosheet channel structure is then blocked and the second gate dielectric layer is removed from the second stacked nanosheet channel structure while the first stacked nanosheet channel structure is blocked. The first stacked nanosheet channel structure is then unblocked, and one or more additional processing operations are performed on the resulting semiconductor structure.

In another embodiment, a semiconductor structure comprises a semiconductor substrate, an N-type stacked nanosheet channel structure formed on the semiconductor substrate, and a P-type stacked nanosheet channel structure formed adjacent to the N-type stacked nanosheet channel structure on the semiconductor substrate. Each of the adjacent N-type and P-type stacked nanosheet channel structures comprises a plurality of stacked channel regions with each such channel region being substantially surrounded by a gate dielectric layer and a gate work function metal layer, and with the gate work function metal layer being separated from the channel regions by the gate dielectric layer. The gate dielectric and gate work function metal layers of the adjacent N-type and P-type stacked nanosheet channel structures are substantially eliminated from a shared gate region between the adjacent N-type and P-type stacked nanosheet channel structures. Different types of gate work function layers comprising different metal materials may be utilized in respective ones of the N-type and P-type stacked nanosheet channel structures.

In a further embodiment, an integrated circuit comprises a plurality of nanosheet CMOS devices with each such CMOS device comprising an NFET and a PFET. The NFET and the PFET of a given one of the plurality of nanosheet CMOS devices comprise respective N-type and P-type stacked nanosheet channel structures formed adjacent to one another on a semiconductor substrate. Each of the adjacent N-type and P-type stacked nanosheet channel structures comprises a plurality of stacked channel regions with each such channel region being substantially surrounded by a gate dielectric layer and a gate work function metal layer, and with the gate work function metal layer being separated from the channel regions by the gate dielectric layer. The gate dielectric and gate work function metal layers of the adjacent N-type and P-type stacked nanosheet channel structures are substantially eliminated from a shared gate region between the adjacent N-type and P-type stacked nanosheet channel structures. Different types of gate work function layers comprising different metal materials may be utilized in respective ones of the N-type and P-type stacked nanosheet channel structures.

BRIEF DESCRIPTION OF THE DRAWINGS

FIGS. 1A and 1B are collectively referred to herein as FIG. 1, and show different cross-sectional views of the same semiconductor structure.

DETAILED DESCRIPTION

Illustrative embodiments are described herein in the context of example processes for WFM patterning in forming adjacent N-type and P-type stacked nanosheet channel structures of respective NFET and PFET devices of a CMOS device. However, it is to be understood that embodiments of the invention are not limited to these illustrative arrangements, but are instead more broadly applicable to a wide variety of different integrated circuits, semiconductor structures, process operations, and other features and functionality. For example, other embodiments are not limited to use with the particular stacked nanosheet channel structures, gate dielectric layers, WFM layers and other features of the illustrative embodiments. Accordingly, different arrangements of layers, materials and alternative semiconductor structures and associated integrated circuits can be used. These and numerous other variations in the disclosed arrangements will be apparent to those skilled in the art.

FIGS. 1 through 10 show a portion of a semiconductor device manufacturing process involving the formation of N-type and P-type stacked nanosheet channel structures of respective NFET and PFET devices of a CMOS device in an illustrative embodiment. The process is applied to a semiconductor wafer in conjunction with the manufacture of integrated circuits. The figures illustrate respective cross-sectional views of a portion of the semiconductor wafer as it undergoes sequential processing operations as part of the process. It is to be appreciated that the various elements and other features shown in these figures are simplified for clarity and simplicity of illustration and are not necessarily drawn to scale.

It should also be noted that references herein to formation of one layer or structure "on" or "over" another layer or structure are intended to be broadly construed, and should not be interpreted as precluding the presence of one or more intervening layers or structures.

The portion of the semiconductor device manufacturing process shown in FIGS. 1 through 10 is illustratively part of a single-pattern or multiple-pattern deep ultraviolet (DUV) or extreme ultraviolet (EUV) lithography process of a type known in the art. Conventional aspects of such DUV or EUV processes are well known in the art and therefore not described in detail herein. By way of example, such lithography processes perform lithographic patterning of semiconductor device features utilizing DUV wavelengths such as 193 nm or EUV wavelengths such as 13.5 nm.

Figure 1A:
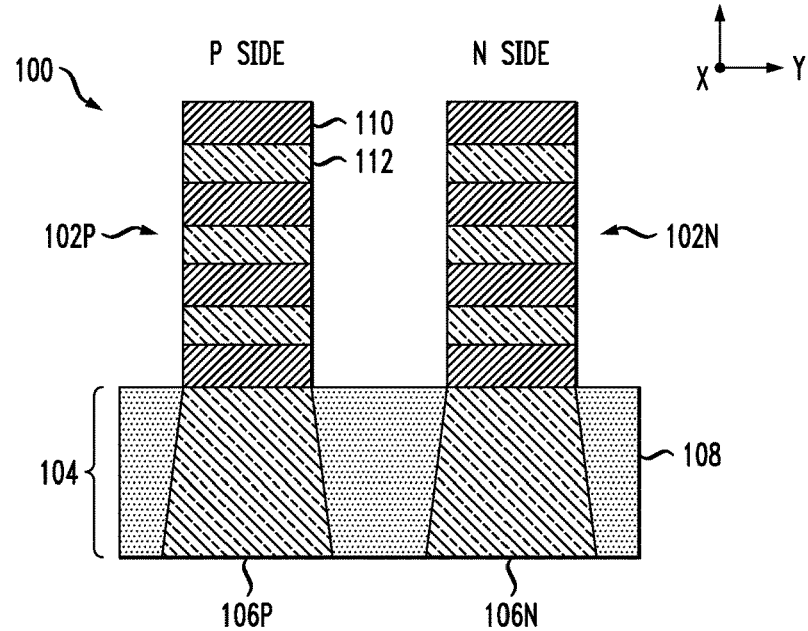
FIG. 1A shows a cross-sectional view of a semiconductor structure following formation of N-type and P-type nanosheet channel structures on a semiconductor substrate in an illustrative embodiment.

Referring initially to FIG. 1A, a semiconductor structure 100 comprises first and second stacked nanosheet channel structures 102N and 102P that are utilized to form device channels of respective NFET and PFET devices of a CMOS device in an illustrative embodiment. The first and second stacked nanosheet channel structures 102N and 102P are formed adjacent to one another on a semiconductor substrate 104 and are associated with respective corresponding semiconductor regions 106N and 106P of the semiconductor substrate 104. The semiconductor regions 106N and 106P are illustratively formed of silicon (Si). The semiconductor substrate 104 also includes insulator regions 108 comprising oxide materials.

Figure 1B:
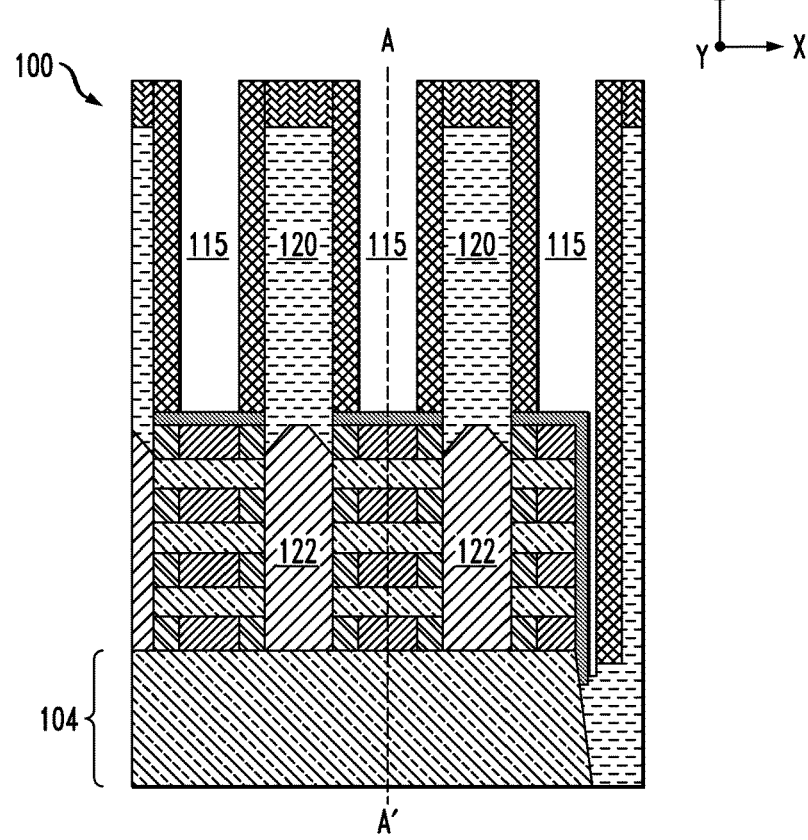
FIG. 1B shows another cross-sectional view of the semiconductor structure of FIG. 1A and shows a section line A-A' along which the cross-sectional view of FIG. 1A is taken.

To provide spatial context to the different structural orientations of the semiconductor structure 100 shown in FIGS. 1A and 1B, XYZ Cartesian coordinates are shown in each of these drawings. It is to be understood that the term "vertical" as used herein denotes a Z-direction of the Cartesian coordinates shown in the drawings. The X-direction and the Y-direction of the Cartesian coordinates are "horizontal" or "lateral" directions, each perpendicular to the other, and both perpendicular to the Z-direction.

Each of the stacked nanosheet channel structures 102N and 102P as illustrated in FIG. 1A comprises a stack of material layers including alternating sacrificial regions 110 and channel regions 112. The sacrificial regions 110 illustratively comprise silicon-germanium (SiGe) and the channel regions 112 illustratively comprise silicon (Si), although other materials can be used for these and other regions disclosed herein.

At this point in the process, the channel regions 112 of each of the stacked nanosheet channel structures have not yet been "released" by removal of their corresponding intermediate sacrificial regions 110. Accordingly, the stacked nanosheet channel structures 102N and 102P at this point in the process are each shown as comprising a plurality of stacked channel regions 112 interspersed with sacrificial regions 110. The first and second stacked nanosheet channel structures 102N and 102P are also referred to as respective N-type and P-type stacked nanosheet channel structures, and as noted above are utilized within the disclosed process to form respective NFET and PFET devices of a CMOS device.

The semiconductor structure 100 represents a portion of a semiconductor wafer having the semiconductor substrate 104. As indicated above, at least portions of the semiconductor substrate 104 may be formed of silicon (Si), and in some embodiments the semiconductor substrate 104 may have a thickness of about 500 to 1000 micrometers (μm). The semiconductor substrate 104 may itself comprise multiple layers, although it is shown as a single layer in the figure, again for clarity and simplicity of illustration.

FIG. 1B shows another cross-sectional view of the semiconductor structure 100 of FIG. 1A and shows the section line A-A' along which the cross-sectional view of FIG. 1A is taken. The regions 115 represent respective dummy gate regions from which polysilicon gate materials have been removed in conjunction with a replacement metal gate (RMG) process. The RMG process generally involves replacing a polysilicon gate of relatively low conductivity with a replacement metal gate having a relatively high conductivity, using techniques that are well known to those skilled in the art. The process illustrated in FIGS. 1 through 10 provides gate work function metal (WFM) patterning as part of such an RMG process.

The regions 120 in FIG. 1B represent source/drain contact regions in which source/drain contacts are formed to underlying source/drain regions 122 that are coupled to the stacked channel regions of the stacked nanosheet channel structures 102N and 102P. A given NFET or PFET device illustratively comprises a source formed at least in part in one of the regions 122 and a drain formed at least in part in another one of the regions 122, with current flow between the source and the drain of the device being controlled by a signal applied to a corresponding gate formed at least in part in one of the regions 115. As indicated above, the process as illustrated in FIGS. 1 through 10 involves formation of gate WFM for a given such semiconductor device in conjunction with an RMG process.

Figure 2:
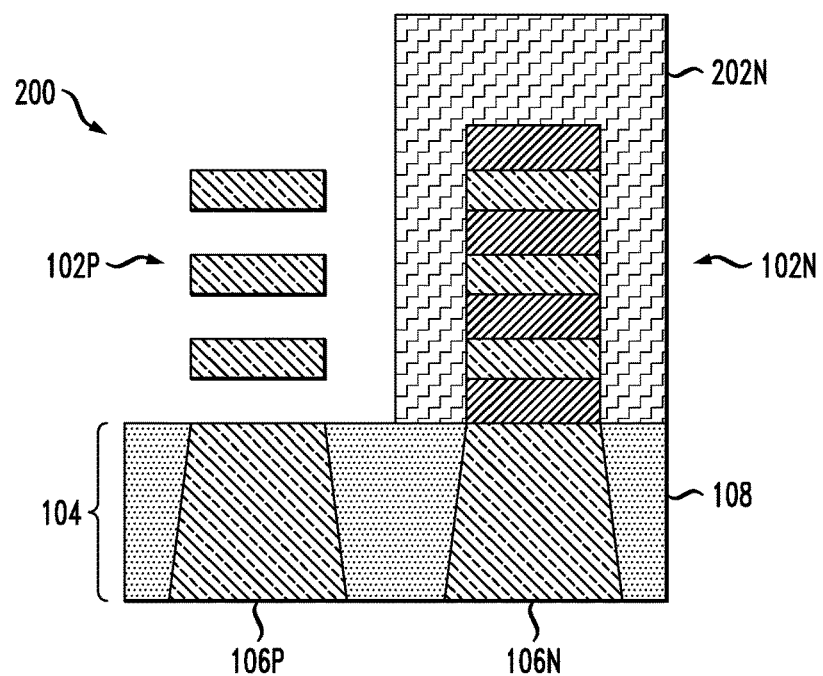
FIG. 2 shows a cross-sectional view of a semiconductor structure in conjunction with blocking of an N-type stacked nanosheet channel structure and sheet release of a P-type stacked nanosheet channel structure in an illustrative embodiment.

Referring now to FIG. 2, a semiconductor structure 200 is shown in which the first stacked nanosheet channel structure 102N is blocked and channel regions 112 of the second stacked nanosheet channel structure 102P have been released by removing the sacrificial regions 110 of the second stacked nanosheet channel structure 102P while the first stacked nanosheet channel structure 102N is blocked. Blocking the first stacked nanosheet channel structure 102N illustratively comprises forming an organic planarizing layer (OPL) 202N over the first stacked nanosheet channel structure 102N. Although the released channel regions 112 of the second stacked nanosheet channel structure 102P appear to "float" in this particular cross-sectional view, the released channel regions 112 remain supported by epitaxial silicon regions as shown in the diagram of FIG. 1B. Other released channel regions shown in other drawings herein remain supported in a similar manner.

The channel regions 112 of the second stacked nanosheet channel structure 102P are illustratively released by applying at least one of a wet etch and a dry etch process to the second stacked nanosheet channel structure 102. For example, a nanosheet release process compatible with the OPL 202N used to block the first stacked nanosheet channel structure 102N can be used. More particularly, such a nanosheet release process compatible with the OPL 202N illustratively comprises a low-temperature silicon-germanium (SiGe) etch process performed at a temperature between about 75° C. and about 100° C., utilizing a selective etchant comprising ammonia ($NH_3$) or chlorine triflouride ($ClF_3$). Similar nanosheet release processes can be used to release the channel regions 112 of the first stacked nanosheet channel structure 102N as described in conjunction with FIG. 6 below.

Figure 3:
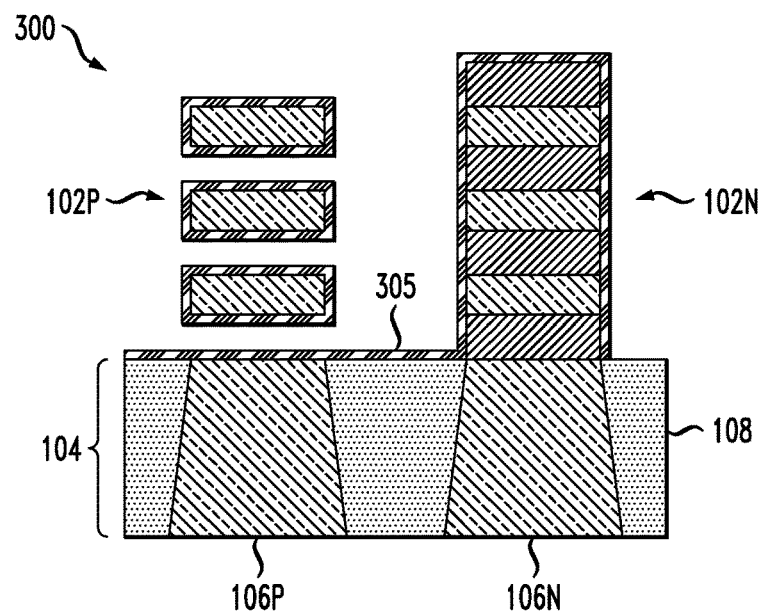
FIG. 3 shows a cross-sectional view of a semiconductor structure following deposition of a first gate dielectric layer over N-type and P-type stacked nanosheet channel structures in an illustrative embodiment.

The first stacked nanosheet channel structure 102N is then unblocked, and a first gate dielectric layer is formed over the first and second stacked nanosheet channel structures 102N and 102P, resulting in the semiconductor structure 300 of FIG. 3. The first gate dielectric layer is denoted by reference numeral 305.

Unblocking the first stacked nanosheet channel structure 102N illustratively involves removing the OPL 202N previously formed over the first stacked nanosheet channel structure 102N. For example, the OPL 202N can be removed through the use of a conventional ashing process, such as a dry etch or more particularly an oxyplasma etch. Other ashing processes referred to herein can be configured in a similar manner.

The first gate dielectric layer 305 is illustratively formed by depositing hafnium oxide ($HfO_2$) to a thickness of about 2 nm to about 5 nm, although alternative materials and thicknesses can be used in other embodiments. The first gate dielectric layer 305 and other gate dielectric layers referred to herein are generally formed from materials having relatively high dielectric constants, also referred to as "high-k" materials.

At this stage in the process, a reliability annealing process may be performed on the first and second stacked nanosheet channel structures 102N and 102P after forming the first gate dielectric layer 305 over the first and second stacked nanosheet channel structures 102N and 102P. The reliability annealing process illustratively comprises forming an annealing layer over the first and second stacked nanosheet channel structures 102N and 102P, forming an amorphous silicon (aSi) layer over the annealing layer, annealing the resulting semiconductor structure, and then removing the annealing layer and the amorphous silicon layer from the annealed semiconductor structure. It is to be appreciated, however, that such an annealing process is not required. The annealing layer in some embodiments may comprise titanium nitride (TiN) or another type of WFM material.

Figure 4:
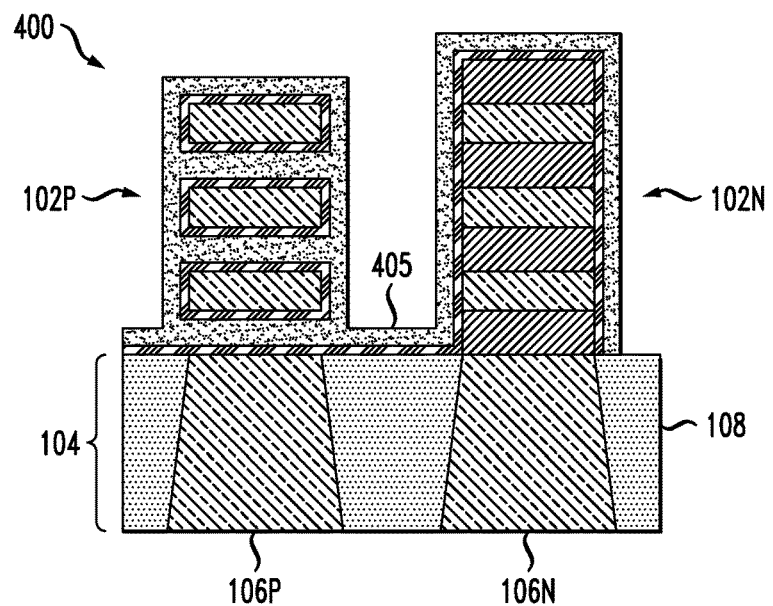
FIG. 4 shows a cross-sectional view of a semiconductor structure following deposition of a first WFM layer over N-type and P-type stacked nanosheet channel structures in an illustrative embodiment.

Referring now to FIG. 4, a semiconductor structure 400 includes a first gate WFM layer 405 formed over the first gate dielectric layer 305. The first gate WFM layer 405 is illustratively formed by depositing at least one of titanium nitride (TiN), tantalum nitride (TaN), titanium carbide (TiC), titanium aluminum carbide (TiAlC) or tantalum aluminum carbide (TaAlC) to a thickness of about 7 nm to about 10 nm. Again, other types of materials and layer thicknesses can be used. In some embodiments, different types of gate WFM layers comprising different metal materials are utilized in respective ones of the N-type and P-type stacked nanosheet channel structures. For example, metal nitrides such as TiN or TaN may be used to form gate WFM layers for P-type stacked nanosheet channel structures, while titanium or aluminum related metals such as TiAlC, TaAlC, TiAl, Ti or Al are used to form gate WFM layers for N-type stacked nanosheet channel structures.

Layer deposition in illustrative embodiments herein can be performed using well-known processes such as atomic layer deposition (ALD), chemical vapor deposition (CVD) and physical vapor deposition (PVD).

Figure 5:
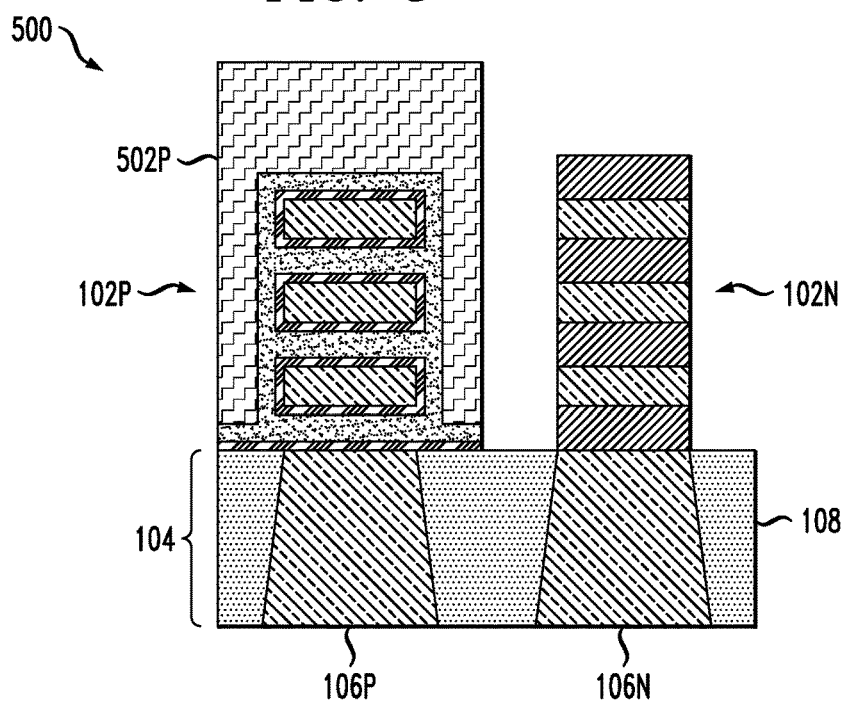
FIG. 5 shows a cross-sectional view of a semiconductor structure in conjunction with blocking of a P-type stacked nanosheet channel structure and stripping of a first WFM layer and a first gate dielectric layer from an N-type nanosheet channel structure in an illustrative embodiment.

As shown in FIG. 5, a semiconductor structure 500 results after blocking the second stacked nanosheet channel structure 102P through formation of OPL 502P, and then removing portions of the first gate dielectric layer and the first gate WFM layer from the first stacked nanosheet channel structure 102N while the second stacked nanosheet channel structure 102P is blocked.

Figure 6:
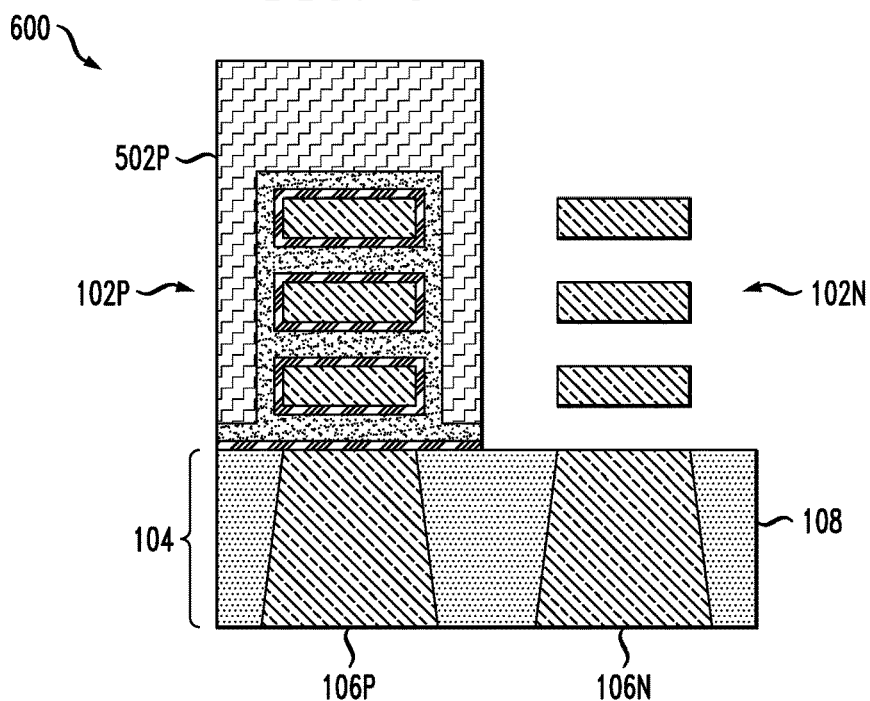
FIG. 6 shows a cross-sectional view of a semiconductor structure following sheet release of an N-type stacked nanosheet channel structure in an illustrative embodiment.

The channel regions 112 of the first stacked nanosheet channel structure 102N are then released by removing the sacrificial regions 110 of the first stacked nanosheet channel structure 102N while the second stacked nanosheet channel structure 102P is blocked by OPL 502P, resulting in the semiconductor structure 600 of FIG. 6.

Figure 7:
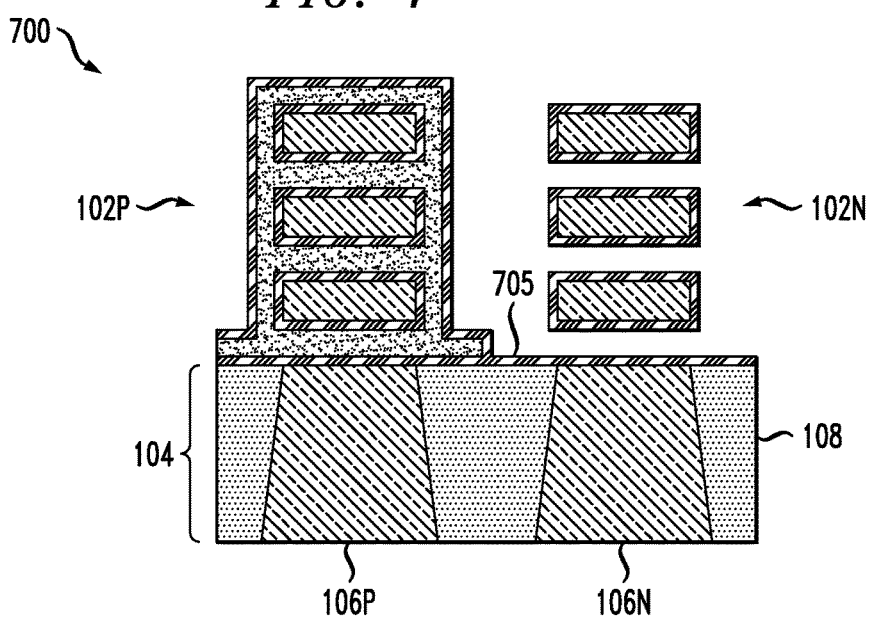
FIG. 7 shows a cross-sectional view of a semiconductor structure following deposition of a second gate dielectric layer over N-type and P-type stacked nanosheet channel structures in an illustrative embodiment.

Referring now to FIG. 7, the second stacked nanosheet channel structure 102P is then unblocked, and a second gate dielectric layer is formed over the first and second stacked nanosheet channel structures 102N and 102P, resulting in the semiconductor structure 700. The second gate dielectric layer is denoted by reference numeral 705.

Unblocking the second stacked nanosheet channel structure 102P illustratively involves removing the OPL 502P previously formed over the second stacked nanosheet channel structure 102P. For example, the OPL 502P can be removed through the use of a conventional ashing process.

The second gate dielectric layer 705 is illustratively formed by depositing hafnium oxide (HfO$_2$) to a thickness of about 2 nm to about 5 nm, although alternative high-k materials and thicknesses can be used in other embodiments.

Figure 8:
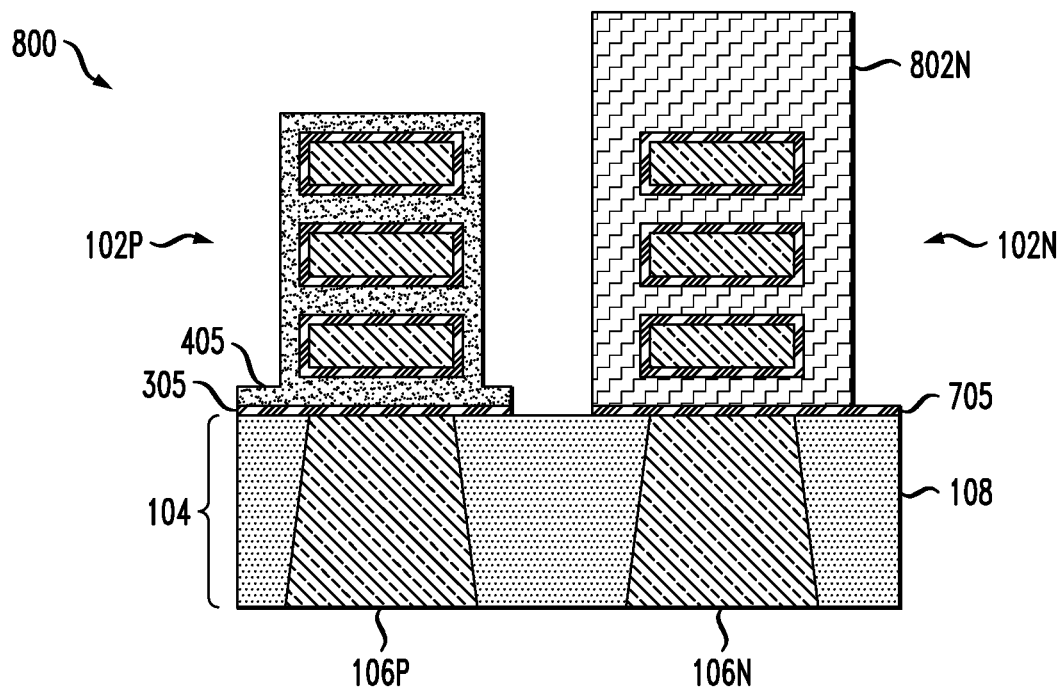
FIG. 8 shows a cross-sectional view of a semiconductor structure in conjunction with blocking of an N-type stacked nanosheet channel structure and removal of a second gate dielectric layer from a first WFM layer on a P-type stacked nanosheet channel structure in an illustrative embodiment.

As shown in FIG. 8, a semiconductor structure 800 results by blocking the first stacked nanosheet channel structure 102N through formation of OPL 802N and removing portions of the second gate dielectric layer 705 from the second stacked nanosheet channel structure 102P while the first stacked nanosheet channel structure 102N is blocked.

Figure 9:
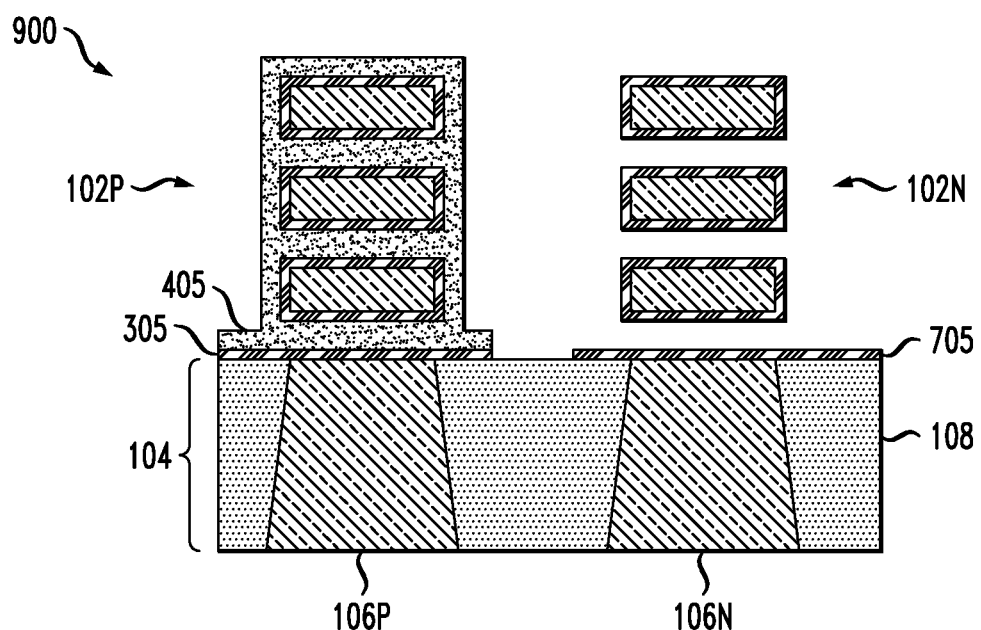
FIG. 9 shows a cross-sectional view of a semiconductor structure following unblocking of an N-type stacked nanosheet channel structure in an illustrative embodiment.

The first stacked nanosheet channel structure 102N is then unblocked, resulting in the semiconductor structure 900 shown in FIG. 9. Unblocking the first stacked nanosheet channel structure 102N illustratively involves removing the OPL 802N previously formed over the first stacked nanosheet channel structure 102N, again through the use of a conventional ashing process.

Figure 10:
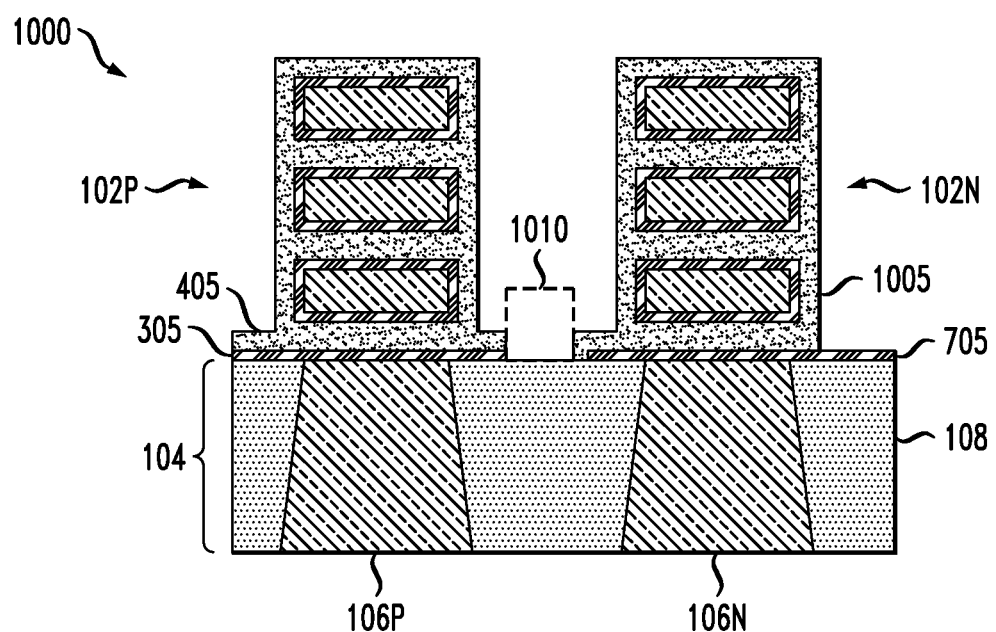
FIG. 10 shows a cross-sectional view of a semiconductor structure after further processing to form a second WFM layer over an N-type stacked nanosheet channel structure in an illustrative embodiment.

Referring now to FIG. 10, a semiconductor structure 1000 includes a second gate WFM layer 1005 formed over the second gate dielectric layer 705. The second gate WFM layer 1005 is illustratively formed by depositing a suitable gate WFM material, such as one or more of the gate WFM materials described above, to a thickness of about 7 nm to about 10 nm. Again, other materials and thicknesses can be used.

As mentioned previously, different types of gate WFM materials can be used in respective ones of the adjacent first and second stacked nanosheet channel structures 102N and 102P. Alternatively, the same gate WFM material can be used in both the first and second stacked nanosheet channel structures 102N and 102P.

In the semiconductor structure 1000, each of the adjacent first and second stacked nanosheet channel structures 102N and 102P comprises a plurality of stacked channel regions 112 with each such channel region 112 being substantially surrounded by corresponding portions of a gate dielectric layer and a gate WFM layer, and with the gate WFM layer being separated from the channel regions 112 by the gate dielectric layer.

Also, the first and second gate dielectric layers 305 and 705 and the first and second gate WFM layers 405 and 1005 are substantially eliminated from a shared gate region 1010 between the adjacent first and second stacked nanosheet channel structures 102N and 102P. The shape and configuration of the region 1010 and the particular arrangement of its bordering layers are illustrative only, and can be varied in other embodiments.

The process of FIGS. 1 through 10 therefore provides low undercut N-P gate WFM patterning in the formation of a semiconductor device such as a CMOS device comprising an NFET and a PFET. This advantageously avoids the above-described problematic situation in which, when patterning WFM portions of nanosheet FET devices in conjunction with RMG formation, etching operations applied to release nanosheet layers of an NFET device channel structure can lead a severe undercut of a portion of the WFM of a corresponding adjacent PFET device channel structure, and vice-versa. Accordingly, illustrative embodiments disclosed herein can provide improved efficiency in manufacture of CMOS integrated circuit devices and corresponding reductions in integrated circuit manufacturing costs. For example, illustrative embodiments can be used to form nanosheet FETs with hi-k dielectric layer material removed from a shared gate region so as to facilitate separate N-P nanosheet release as well as wet processing budget reduction.

The semiconductor structure 1000 of FIG. 10 is subject to additional processing operations of a type well known to those skilled in the art, in order to form desired integrated circuit structures on the semiconductor wafer. In other embodiments, other types of layers, materials and other structural features can be used.

Although the first and second stacked nanosheet channel structures in the process as illustrated in FIGS. 1 through 10 are illustratively shown as respective N-type and P-type stacked nanosheet channel structures, this is by way of example only and should not be construed as limiting in any way. For example, the process can be modified in a straightforward manner so as to be implemented for first and second stacked nanosheet channel structures that comprise respective P-type and N-type stacked nanosheet channel structures.

Illustrative embodiments include various types of semiconductor structures. For example, a semiconductor structure in one embodiment comprises a semiconductor substrate, an N-type stacked nanosheet channel structure formed on the semiconductor substrate, and a P-type stacked nanosheet channel structure formed adjacent to the N-type stacked nanosheet channel structure on the semiconductor substrate. Each of the adjacent N-type and P-type stacked nanosheet channel structures comprises a plurality of stacked channel regions with each such channel region being substantially surrounded by a gate dielectric layer and a gate WFM layer, and with the gate WFM layer being separated from the channel regions by the gate dielectric layer. The gate dielectric and gate WFM layers of the adjacent N-type and P-type stacked nanosheet channel structures are substantially eliminated from a shared gate region between the adjacent N-type and P-type stacked nanosheet channel structures. Different types of gate WFM layers comprising different metal materials may be utilized in respective ones of the N-type and P-type stacked nanosheet channel structures.

Other illustrative embodiments can include integrated circuits. For example, an integrated circuit in one embodiment comprises a plurality of nanosheet CMOS devices with each such CMOS device comprising an NFET and a PFET. The NFET and the PFET of a given one of the plurality of nanosheet CMOS devices comprise respective N-type and P-type stacked nanosheet channel structures formed adjacent to one another on a semiconductor substrate. Each of the adjacent N-type and P-type stacked nanosheet channel structures comprises a plurality of stacked channel regions with each such channel region being substantially surrounded by a gate dielectric layer and a gate WFM layer, and with the gate WFM layer being separated from the channel regions by the gate dielectric layer. The gate dielectric and gate WFM layers of the adjacent N-type and P-type stacked nanosheet channel structures are substantially eliminated from a shared gate region between the adjacent N-type and P-type stacked nanosheet channel structures.

As indicated above, different types of gate WFM layers comprising different metal materials may be utilized in respective ones of the N-type and P-type stacked nanosheet channel structures. For example, metal nitrides such as TiN or TaN may be used to form gate WFM layers for P-type stacked nanosheet channel structures, while titanium or aluminum related metals such as TiAlC, TaAlC, TiAl, Ti or Al are used to form gate WFM layers for N-type stacked nanosheet channel structures.

Additional illustrative embodiments include lithography tools and other types of lithographic patterning equipment that are configured to perform processing operations such as those described above in conjunction with the manufacture of semiconductor integrated circuits. For example, an EUV lithography tool such as the ASML NXE:3300B or NXE:3350B operating at a wavelength of 13.5 nm can be modified to perform a process of the type described above in conjunction with forming CMOS devices. Again, other types of lithography processes and associated lithography tools can be used, based on patterning radiation at DUV wavelengths or other wavelengths, and the techniques disclosed herein are therefore not limited to use with particular lithography processes or lithography tools.

Examples of integrated circuit structures that can be formed using processes as disclosed herein include the above-noted CMOS devices, as well as other types of nanosheet metal-oxide-semiconductor field-effect transistor (MOSFET) devices. The disclosed processes facilitate the manufacture of such devices by eliminating excessive undercutting of blocked stacked nanosheet channel structures, thereby facilitating the formation of sub-10 nm features. Similar improvements are provided for alternative ranges of feature sizes, such as sub-50 nm features. A wide variety of other types of integrated circuit devices can be fabricated using an integrated circuit manufacturing process that includes one or more iterations of at least portions of the steps shown in FIGS. 1 through 10.

In the description above, various materials and dimensions for different elements are provided. Unless otherwise noted, such materials are given by way of example only and embodiments are not limited solely to the specific examples given. Similarly, unless otherwise noted, all dimensions are given by way of example and embodiments are not limited solely to the specific dimensions or ranges given.

It is to be understood that the various layers, structures, and/or regions described above are not necessarily drawn to scale. In addition, for ease of explanation one or more layers, structures, and regions of a type commonly used to form semiconductor devices or structures may not be explicitly shown in a given drawing. This does not imply that any layers, structures, and regions not explicitly shown are omitted from the actual semiconductor structures.

Furthermore, it is to be understood that the embodiments discussed herein are not limited to the particular processing steps shown and described herein. In particular, with respect to semiconductor processing steps, it is to be emphasized that the descriptions provided herein are not intended to encompass all of the processing steps that may be used to form a functional semiconductor integrated circuit device. Rather, certain processing steps that are commonly used in forming semiconductor devices, such as, for example, wet cleaning and annealing steps, are purposefully not described in detail herein for economy of description.

Terms such as "about" or "substantially" as used herein with regard to thicknesses, widths, percentages, ranges, etc., are meant to denote being close or approximate to, but not exactly. For example, the term "about" or "substantially" as used herein implies that a small margin of error may be present such as, by way of example only, 1% or less than the stated amount. Also, in the figures, the illustrated scale of one layer, structure, and/or region relative to another layer, structure, and/or region is not necessarily intended to represent actual scale.

Semiconductor devices and methods for forming same in accordance with the above-described techniques can be employed in various applications, hardware, and/or electronic systems, including but not limited to personal computers, communication networks, electronic commerce systems, portable communications devices (e.g., cell and smart phones), solid-state media storage devices, functional circuitry, etc. Given the teachings provided herein, one of ordinary skill in the art will be able to contemplate other implementations and applications of embodiments of the invention.

In some embodiments, the above-described techniques are used in connection with manufacture of semiconductor integrated circuit devices that illustratively comprise, by way of non-limiting example, CMOS devices, MOSFET devices, and/or FinFET devices, and/or other types of semiconductor integrated circuit devices that incorporate or otherwise utilize CMOS, MOSFET, and/or FinFET technology.

Accordingly, at least portions of one or more of the semiconductor structures described herein may be implemented in integrated circuits. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of forming a semiconductor structure, comprising:
    forming adjacent first and second stacked nanosheet channel structures on a semiconductor substrate, each nanosheet channel structure comprising a plurality of stacked channel regions interspersed with sacrificial regions;
    blocking the first stacked nanosheet channel structure and releasing channel regions of the second stacked nanosheet channel structure by removing the sacrificial regions of the second stacked nanosheet channel structure while the first stacked nanosheet channel structure is blocked;

unblocking the first stacked nanosheet channel structure and forming a first gate dielectric layer over the first and second stacked nanosheet channel structures;

forming a first gate work function metal layer over the first gate dielectric layer;

blocking the second stacked nanosheet channel structure and removing the first gate dielectric layer and the first gate work function metal layer from the first stacked nanosheet channel structure while the second stacked nanosheet channel structure is blocked;

releasing channel regions of the first stacked nanosheet channel structure by removing the sacrificial regions of the first stacked nanosheet channel structure while the second stacked nanosheet channel structure is blocked;

unblocking the second stacked nanosheet channel structure and forming a second gate dielectric layer over the first and second stacked nanosheet channel structures;

blocking the first stacked nanosheet channel structure and removing the second gate dielectric layer from the second stacked nanosheet channel structure while the first stacked nanosheet channel structure is blocked; and unblocking the first stacked nanosheet channel structure.

2. The method of claim 1 wherein blocking a given one of the first and second stacked nanosheet channel structures comprises forming an organic planarizing layer over the given stacked nanosheet channel structure.

3. The method of claim 2 wherein unblocking the given one of the first and second stacked nanosheet channel structures comprises removing the organic planarizing layer formed over the given stacked nanosheet channel structure.

4. The method of claim 3 wherein removing the organic planarizing layer formed over the given stacked nanosheet channel structure comprises applying an ashing process to the organic planarizing layer.

5. The method of claim 1 wherein forming a given one of the first and second gate dielectric layers comprises depositing hafnium oxide ($HfO_2$) to form the given gate dielectric layer.

6. The method of claim 1 wherein forming a given one of the first and second gate dielectric layers comprises depositing the given gate dielectric layer to a thickness of about 2 nm to about 5 nm.

7. The method of claim 1 wherein forming the first gate work function metal layer comprises depositing at least one of titanium nitride (TiN), tantalum nitride (TaN), titanium carbide (TiC), titanium aluminum carbide (TiAlC) and tantalum aluminum carbide (TaAlC) to form the first gate work function metal layer.

8. The method of claim 1 wherein forming the first gate work function metal layer comprises depositing the first gate work function metal layer to a thickness of about 7 nm to about 10 nm.

9. The method of claim 1 wherein releasing channel regions of a given one of the first and second stacked nanosheet channel structures comprises applying at least one of a wet etch and a dry etch process to the given stacked nanosheet channel structure.

10. The method of claim 1 wherein releasing channel regions of a given one of the first and second stacked nanosheet channel structures comprises applying a nanosheet release process compatible with an organic planarizing layer used to block the other one of the first and second stacked nanosheet channel structures.

11. The method of claim 10 wherein the nanosheet release process compatible with the organic planarizing layer comprises a low-temperature silicon-germanium (SiGe) etch process performed at a temperature between about 75° C. and about 100° C.

12. The method of claim 1 further comprising performing a reliability annealing process on the first and second stacked nanosheet channel structures after forming the first gate dielectric layer over the first and second nanosheet channel structures, and wherein the reliability annealing process comprises:

forming an annealing layer over the first and second stacked nanosheet channel structures;

forming an amorphous silicon layer over the annealing layer;

annealing a resulting semiconductor structure; and removing the annealing layer and the amorphous silicon layer from the annealed structure.

13. The method of claim 1 wherein the stacked channel regions of the second nanosheet channel structure in a resulting semiconductor structure are each substantially surrounded by the first gate dielectric layer and the first gate work function metal layer, with the first gate work function metal layer being separated from the channel regions by the first gate dielectric layer.

14. The method of claim 1 wherein the first and second gate dielectric layers and the first gate work function metal layer are substantially eliminated from a shared gate region between the adjacent first and second stacked nanosheet channel structures.

* * * * *